(12) United States Patent
Cross et al.

(10) Patent No.: US 7,017,430 B2
(45) Date of Patent: Mar. 28, 2006

(54) INSPECTION DEVICE AND INSPECTION METHOD OF DIELECTRIC FILM, AND METHOD OF MANUFACTURING SEMICONDUCTOR DEVICE

(75) Inventors: Jeffrey S. Cross, Kawasaki (JP); Mineharu Tsukada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 208 days.

(21) Appl. No.: 10/437,892

(22) Filed: May 15, 2003

(65) Prior Publication Data
US 2003/0221496 A1   Dec. 4, 2003

(30) Foreign Application Priority Data
May 28, 2002   (JP) .............................. 2002-154103

(51) Int. Cl.
*G01M 19/00* (2006.01)
(52) U.S. Cl. ..................................... 73/865.8
(58) Field of Classification Search ............... 73/865.8, 73/865.6; 118/712; 427/8
See application file for complete search history.

(56) References Cited

U.S. PATENT DOCUMENTS 6,546,820 B1 *   4/2003   Van et al. ................... 73/865.8

* cited by examiner

*Primary Examiner*—Robert Raevis
(74) *Attorney, Agent, or Firm*—Westerman, Hattori, Daniels & Adrian, LLP

(57) ABSTRACT

After placing a sample in a heating vacuum chamber, a probe is climbed down to a position above a capacitor formed in the sample whose electrical characteristic is supposed to be measured. The probe is contacted with both electrodes of the capacitor, which is confirmed by electrical measurement. In order to measure capacitance loss, after filling $N_2$ gas up in the heating vacuum chamber, a mixed gas is introduced from a line for 3 vol % $H_2$+97 vol % $N_2$ to the inside of the heating vacuum chamber. After pressure has been stabilized there, capacitance loss and lapsed time are measured at the same time. Concentrations of residual $H_2O$ and residual $O_2$ in the heating vacuum chamber are measured by a quadrupole mass spectrometer QMS; and at the same time, concentrations of each of residual $H_2O$ and residual $O_2$ in an exhaust gas are measured by sensors.

19 Claims, 8 Drawing Sheets

INSPECTION DEVICE AND INSPECTION METHOD OF DIELECTRIC FILM, AND METHOD OF MANUFACTURING SEMICONDUCTOR DEVICE

CROSS-REFERENCE TO RELATED APPLICATIONS

This application is based upon and claims the benefit of priority from the prior Japanese Patent Application No. 2002-154103, filed on May 28, 2002, the entire contents of which are incorporated herein by reference.

BACKGROUND OF THE INVENTION

1. Field of the Invention

This invention relates to an inspection device and an inspection method of a dielectric film, which is suitable for inspecting characteristic of a ferroelectric film of a ferroelectric random access memory or the like, and a method of manufacturing a semiconductor device.

2. Description of the Related Art

Volatile memories such as dynamic random access memory (DRAM), static random access memory (SRAM) and the like are used as a main memory of computers. The volatile memories retain data only when power supply is supplied. These data disappear when power supply is cut off. In contrast, a ferroelectric random access memory (hereinafter referred to as FeRAM) using a ferroelectric film has recently attracted a great deal of attention as a rewritable nonvolatile memory which does not lose data in case of cut off of power supply. The strength of a FeRAM is not only a nonvolatile memory but also low electrical power consumption and high-density design.

A conventional FeRAM comprises a ferroelectric capacitor 15 (hereinafter referred to as FeCap) which is shown in FIG. 8 and which is composed of a ferroelectric film 13 between two electrodes 12 and 14. The FeCap 15 is formed above e.g., a semiconductor substrate 11 with an insulation film (not shown) between them. This FeCap 15 is a functional main part of FeRAM; furthermore, it is often used as a sensor. The ferroelectric film 13 is composed of Perovskite materials such as Pb (Zr, Ti) $O_3$ (hereinafter referred to as PZT) and the like. Both electrodes 12 and 14, which sandwich the ferroelectric film 13 in are often called an upper electrode and a lower electrode, respectively. Materials such as Pt, Ir or $IrO_x$ and the like are used for these electrodes.

Characteristic of FeCap must be stabilized for improving storage density of these FeRAM. Characteristic of Fecap tends to deteriorate when a ferroelectric film absorbs $H_2$ or water vapor during manufacturing process of FeRAM. For example, $H_2$ or water vapor tend to be produced during deposition process of an interlayer insulation film or an interlayer metal film. A capacitor with high resistance against dissociation of hydrogen is likely to possess higher reliability. Such characteristic deterioration tends to be facilitated when $H_2$ is dissociated by a catalyst of metals such as Pt or Ir or the like which are used as materials of electrodes (S. Aggarwal, S. R. Perusse, C. W. Tipton, R. Ramesh, H. D. Drew, T. Venkatesan, D. B. Romero, V. B. Podobedov and A. Weber: Appl. Phys. Lett. 73 1973 (1998)). This dissociation represents a following chemical formula 1. "M" in the chemical formula 1 means a catalyst metal, and "–" in the right part of the formula means catalysis reaction.

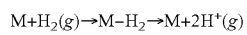

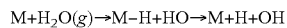 [Chemical Formula 1]

$H_2$ is widely used during manufacturing process of FeRAM and produced as a by-product. In the case that reduced $IrO_x$ or Ir is used as a material of an upper electrode, $H_2$ is dissociated into protons when it reaches to high temperature during manufacturing process. Furthermore, it will be diffused into a ferroelectric film such as a PZT film. As a result, ferroelectric characteristic will be deteriorated (K. Kushida-Abdelghafar, M. Hiratani and Y. Fujisaki: J. Appl. Phys. 85 1069 (1999) and J. S. Cross et al, Jap. J. Appl. Phys., 41 698 (2002)). Both rate of reaction and diffusion velocity are raised when $H_2$ reaches to high temperature.

Recently, an experiment relating to deterioration of characteristics of a capacitor has conducted in reduction gas atmosphere which contains $H_2$ or $D_2$ under a high temperature situation. In this experiment, first, a capacitor is heated (baking) for a specific amount of time in a vacuum chamber which contains the above-described reduction gas atmosphere. Then, the sample is taken out of there, and an amount of remaining ferroelectric characteristic of the sample is measured in the air. By repeating this kind of heating up and measurement, time to disappear ferroelectric characteristic is calculated. This time is helpful information about process of a semiconductor device comprising FeCap when assessing resistance against dissociation of hydrogen of FeCap.

A problem of the above-described inspection method of a ferroelectric film is that it takes extremely long time because both baking in the chamber and measuring characteristic out of the chamber must be alternatively repeated many times due to uncalculated time to deteriorate ferroelectric characteristic. Furthermore, it is extremely difficult to identify actual time to deteriorate ferroelectric characteristic. This is because both the heat up process and the measurement process must be repeated many times until ferroelectric characteristic completely disappears.

FeCap is sensitive to water vapor, and hydrogen-induced degradation is observed during measurement of electric property (Chen et al. Appl. Phys. Lett., 80, 3587 (2002)). The following chemical formula 2 represents emergence of hydrogen.

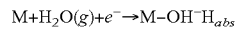 [Chemical Formula 2]

This kind of reaction can be observed when an electric field is impressed on a capacitor in a specific measurement as the same reaction of hydrolysis.

SUMMARY OF THE INVENTION

The present invention was invented in consideration of the above-described problems. An object of the present invention is to provide an inspection device and an inspection method of a dielectric film which enables to inspect characteristic of a ferroelectric film more accurately and easily, and a method of manufacturing a semiconductor device.

Inventors of the present invention made up the following embodiments after extremely careful consideration.

The inspection device of a dielectric film relating to the present invention comprises a chamber for taking in a sample with which a dielectric film is provided and which is intended for inspection. A probe is equipped in the chamber. The inspection device comprises a heater for heating the sample taken in the chamber, and a measure for measuring characteristic of the dielectric film with the probe when the sample is heated by the heater.

According to the present invention, since the probe is equipped in the chamber, characteristic of the sample can be measured in-site while heating the sample in the chamber.

Therefore, it is possible to keep track of change of characteristic of the sample and to obtain accurate information.

As described above, hydrogen-induced degradation of the capacitor happens while conventional measuring process of electric property as well, which means measurement of deterioration of capacity of the capacitor in the air is not enough. This is because air naturally comprises $O_2$, $N_2$, $H_2O$, Ar and $CO_2$. The present invention makes it possible to measure characteristic a dielectric film of a sample in the chamber while heating. Conventional measurement of characteristic and impurity gases such as $H_2O$ and the like are responsible for defect and shortened life. The present invention makes it possible to measure characteristic more accurately and easily since the measurement is carried out while controlling gas composition in the chamber. No device for in-site measuring a ferroelectric capacitor from room temperature to high temperature while flowing e.g., $H_2$ gas and/or $H_2O$ gas has been invented.

DETAILED DESCRIPTION OF THE PREFERRED EMBODIMENTS

Figure 1:
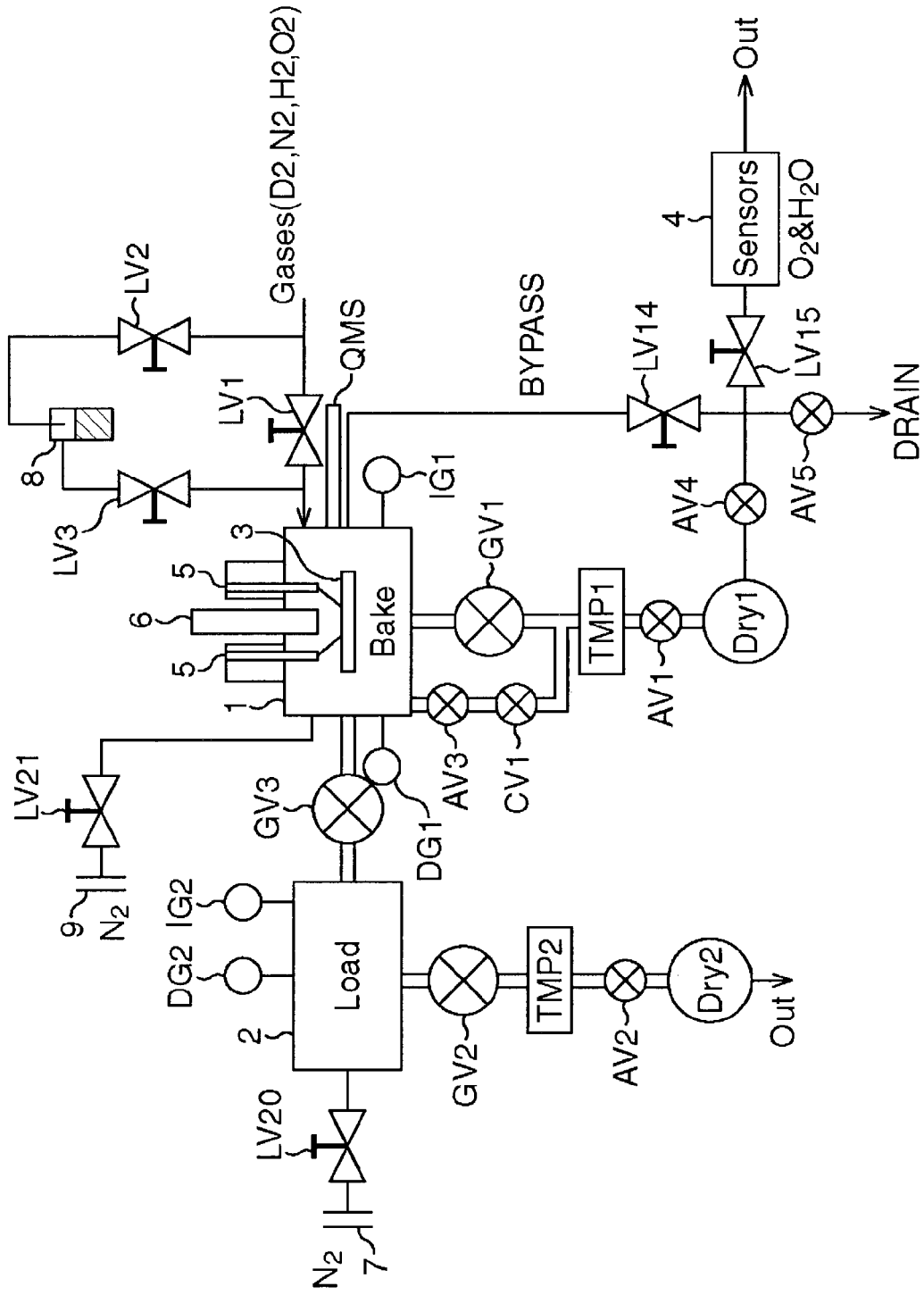
FIG. 1 is a schematic view of a structure of an inspection device of a dielectric film which is related to an embodiment of this invention.

The following description is an inspection device and an inspection method of a dielectric film and a method of manufacturing a semiconductor device, which is related to a preferred embodiment of the present invention with reference to the attached drawings. FIG. 1 is a schematic view of a structure of an inspection device of a dielectric film which is related to an embodiment of the present invention.

The inspection device of a dielectric film relating to the preferred embodiment is equipped with a heating vacuum chamber 1 and a load lock chamber 2. Both the heating vacuum chamber 1 and the load lock chamber 2 are communicated with each other, and a gate valve 3 is equipped between them.

The load lock chamber 2 is equipped with a diaphragm gage DG2 and an ionization gage IG2. Two pipes are linked with the load lock chamber 2, and they are also linked with a pump TMP2 and an $N_2$ line 7, respectively. A valve LV20 is equipped between the load lock chamber 2 and the $N_2$ line 7, and a gate valve GV2 is equipped with the pipe linked with the TMP2. A dry pump Dry2 is linked after a valve AV2 at an exhaust section of the pump TMP2.

A carrier arm (not shown) for conveying a tray with a sample on it to the heating vacuum chamber 1 is also equipped there. This carrier arm moves between the load lock chamber 2 and the heating vacuum chamber 1, passing through the gate valve GV3.

Figure 2:
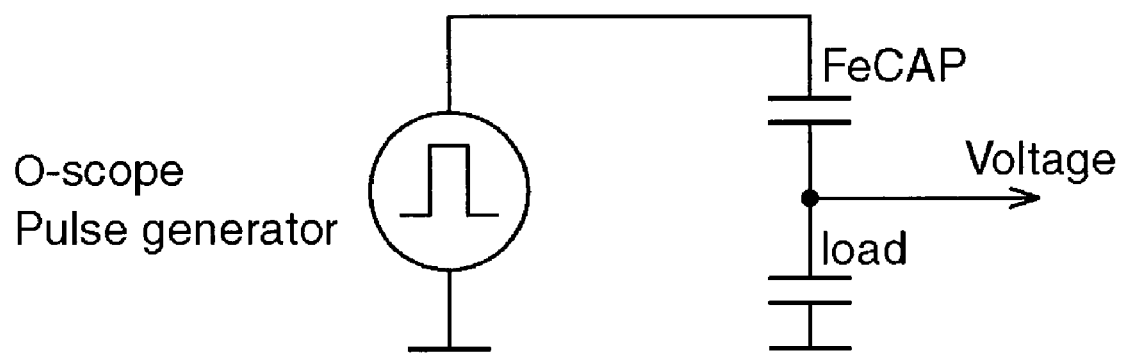
FIG. 2 is a circuit diagram of a configuration of a PUND pulse generator.
Figure 3:
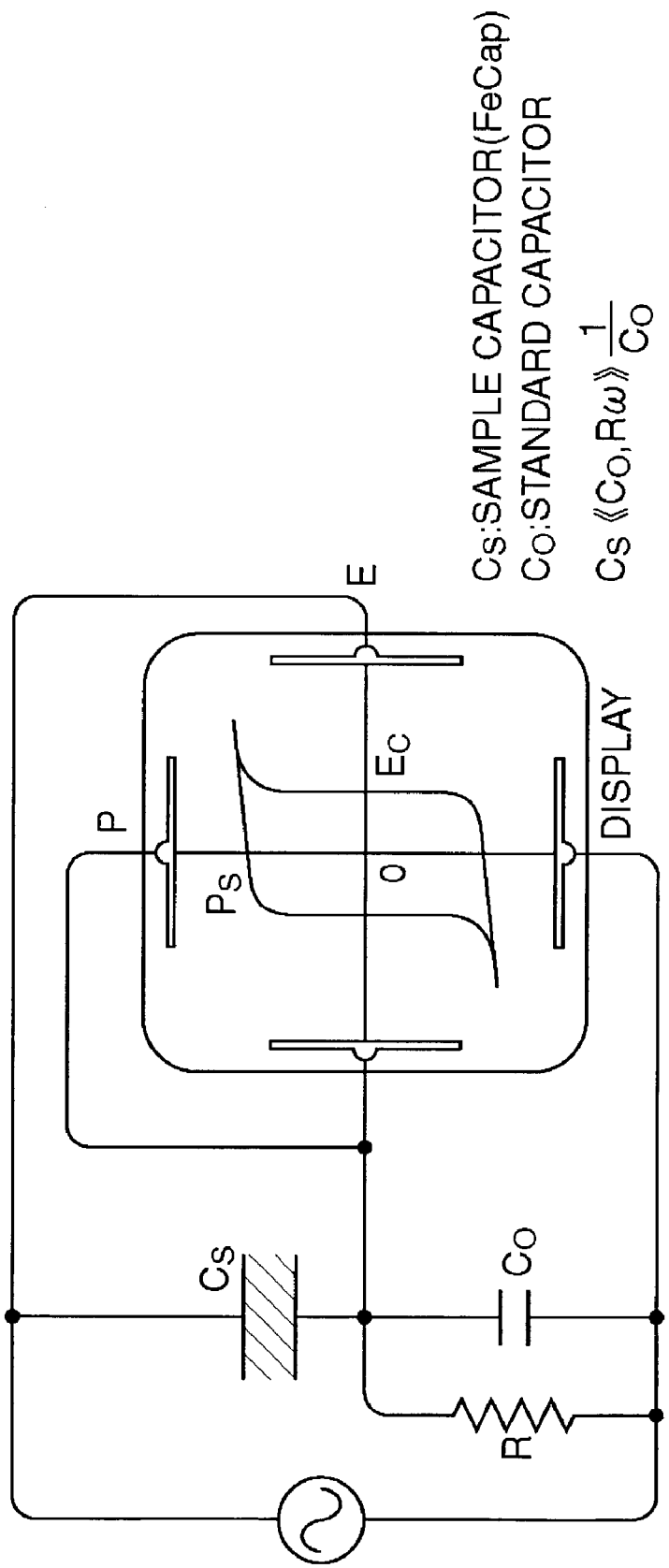
FIG. 3 is a circuit diagram of a configuration of Sawyer-Tower circuit.

A heating table (a heating means) 3 for placing and heating a sample on it and a carrier pin (not shown) to move the sample from the load lock chamber 2 to the heating table 3 by using the carrier arm are equipped with the heating vacuum chamber 1. The heating table 3 is e.g., discoid with 30.48 cm (12 inches) in diameter, and is constructed to heat the sample until 500° C. A probe 5 for measuring electrical characteristic of the sample and a CCD microscope 6 (a location detector) for detecting the location between the probe 5 and the sample are equipped with an upper portion of the heating vacuum chamber 1. The CCD microscope 6 is connected with a display device (not shown) such as liquid crystal display (LCD) so that an operator can easily figure out the locations described before. As shown in FIG. 2 and FIG. 3, the probe 5 is connected with Sawyer-Tower circuit which is comprised of 5.6 nF load capacitance, an oscilloscope, and a pulse generator (a voltage supplier). This Sawyer-Tower circuit is connected with a personal computer through GPIB interface. PUND pulse is emitted from the pulse generator depending upon a program. The sample is impressed through the probe 5. Sample data is downloaded from the probe 5 to the personal computer via the oscilloscope, and calculated. This personal computer records components of a gas flowing in the heating vacuum chamber 1 as a recorder, and the display device connected with the personal computer displays the components of the gas.

A gas introducing port (not shown) is provided with the heating vacuum chamber 1 for introducing gases such as heavy hydrogen ($D_2$), nitrogen ($N_2$) hydrogen ($H_2$), oxygen ($O_2$) and the like. A flow rate of these gases can be controlled by a flow rate controlling device (not shown) such as a mass flow controller and the like which are provided at each of the gas introducing ports. A valve LV1 is equipped between the flow rate controlling device and the gas introducing port. A line for $N_2$, a line for 3 vol % $D_2$+97 vol % $N_2$, a line for gaseous mixture, a line for $O_2$, and 3 vol % $H_2$+97 vol % $N_2$, for example, are linked with the upstream of the valve LV1 as gas introducer. A valve LV2, a gas bubbler 8 and a valve LV3 are linked with the line where the valve 1 is connected from the order of upstream of the gases. A diaphragm gage DG1, an ionization gage IG1, and a quadrupole mass spectrometer (a component measure) QMS are equipped with the heating vacuum chamber 1. Furthermore, a gas introducing port (not shown) for introducing nitrogen ($N_2$) is provided with the heating vacuum chamber 1, and a valve LV21 is linked with this gas introducing port. The other end of the valve LV21 is linked with an $N_2$ line 9.

Three additional pipes are linked with the heating vacuum chamber 1. A gate valve GV1 is equipped with one of them. A valve AV3 and a pressure control valve CV1 (a pressure adjuster) are equipped with another from the side of the heating vacuum chamber 1, and the rest is a bypass. The pipe equipped with the gate valve GV1 is linked with the pipe with which the valve AV3 and a pressure control valve CV1 are connected at the other end of the heating vacuum chamber 1. A pump TMP1 is linked with the pipe after a connecting portion of these pipes. At the exhausting port of the pump TMP1, a dry pump Dry1 is linked after a valve AV1. A valve LV14 and a valve AV4 are equipped at the exhausting port of the bypass and the pump TMP1, and they are linked with the valve LV14 and the valve AV4. Furthermore, two additional pipes are linked with the connecting portion. A sensor 4 for $O_2$ and $H_2O$ (an oxygen concentration measure and a moisture measure) with a mass flow controller (a flowmeter (not shown)) are linked with one pipe after a valve LV15. The other linked with a valve AV5 is a drain.

The following description is the inspection method of a dielectric film when using the above-described inspection device.

First, a sample of FeCap is produced above a wafer. It may be produced by a method which is already known such as a method disclosed by Japanese Patent Laid-opened No.2001-127262. A ferroelectric capacitor is e.g., planar structured, and its upper electrode is etched by reactive ion etching method (See J. S. Cross et al, Jap. J. Appl. Phys., 41 698 (2002)).

Meanwhile, a wafer tray (not shown) is heated to 150° C. by controlling the temperature controller (not shown). This temperature is stabilized in an hour, for example. After producing the sample, a lid of the load lock chamber 2 is opened, and the sample is placed on the wafer tray (not shown) and this wafer tray is placed on the carrier arm in the load lock chamber 2. This wafer tray is made from e.g., quartz. There is no limit of length of its diameter. For example, if a diameter of the sample is less than six inches (approximately 152 mm), a diameter of the wafer tray may be 152 mm. This wafer tray is, for example, made of SUS304 steel or of Cu on which Au is coated.

The lid of the load lock chamber 2 is closed after the tray is placed on the carrier arm. Then, valve GV2 and the valve AV2 are turned on. The pump TMP2 and the dry pump Dry2 are operated and air of the load lock chamber 2 is exhausted. At the same time, the valve GV1, the valve AV1, the valve AV4 and the valve AV5 are turned on. The pump TMP1 and the dry pump Dry1 are operated and air of the heating vacuum chamber 1 is exhausted. After pressure in the heating vacuum chamber 1 and the load lock chamber 2 reaches $10^{-6}$ Torr (approximately $1.33 \times 10^{-4}$ Pa), the gate valve GV3 is turned on, and the sample placed on the carrier arm is conveyed to the heating vacuum chamber 1. At the same time of this conveyance, the wafer tray which has been heated to a reasonable temperature, e.g., 150° C., is conveyed to the heating vacuum chamber 1.

The carrier pin in the heating vacuum chamber 1 is raised by barometric pressure control so that the carrier pin can pick up the wafer tray. After that, the carrier arm returns to the load lock chamber 2. Then, the carrier pin is climbed down so that the sample can be placed on the heating table 3. The gate valve 3 is turned off.

The probe 5 is climbed down to a position above a capacitor formed in the sample whose electrical characteristic is supposed to be measured. The plane shape of the capacitor is, e.g., a square with 50 μm of each length. The location of the capacitor and the probe 5 can be confirmed by LCD which is connected with the CCD microscope 6. Each location of the probe 5 and the CCD microscope 6 can be moved by a micrometer manipulator. The probe 5 is contacted with both electrodes of the capacitor, which can be confirmed by electrical measurement.

The valve LV1 is turned on, and the flow rate is set up as 500 sccm by the mass flow controller. $N_2$ gas is introduced from the gas introducing port to the inside of the heating vacuum chamber 1. The valve LV14 and the valve LV15 are turned on as soon as the valve AV5 is turned off. Then, an exhaust gas from the heating vacuum chamber 1 is flowed into the sensor 4, which measures concentrations of the residual $H_2O$ and the residual $O_2$. They are regularly measured, and e.g., displayed on the display device, and recorded at the personal computer.

In order to start measuring capacitance loss, the flow rate for $N_2$ line is set up as 0 sccm by the mass flow controller, and the counterpart for 3 vol % $H_2$+97 vol % $N_2$ is set up as 500 sccm. Then, the valve AV3 is turned on and the gate valve GV1 is turned off. After that, pressure in the heating vacuum chamber 1 is controlled at 5 Torr (approximately 665 Pa) by controlling the pressure control valve CV1.

After pressure has been stabilized, capacitance loss is measured and the lapse time for it is measured at the same time. Concentrations of the residual $H_2O$ and the residual $O_2$ in the heating vacuum chamber 1 are measured by the quadrupole mass spectrometer QMS; and at the same time, concentrations of the residual $H_2O$ and the residual $O_2$ in the exhaust gas are measured by the sensor 4. Loss of a ferroelectric capacitor can be measured by, for example, measuring remanent polarization Qsw of the capacitor when impressed voltage is set up as 3V. This remanent polarization Qsw can be measured by using the PUND pulse circuit shown in FIG. 2 and the Sawyer-Tower circuit shown in FIG. 3. Remanent polarization Qsw can be measured every five minutes until it decreases by 10% from the time measuring has started.

After remanent polarization Qsw has been measured, the flow rate for 3 vol % $H_2$+97 vol % $N_2$ line is set up as 0 sccm by the mass flow controller, and the gate valve GV1 is turned on. The gate valve GV3 is turned on after the gas which contains $H_2$ is completely exhausted. The wafer tray on the heating table 3 is lifted up to the height by the carrier pin where it is conveyable. The carrier arm is extended to the inside the heating vacuum chamber 1, and the wafer tray is placed on the carrier arm. The wafer tray is conveyed to the load lock chamber 2, and the gate valve GV3 is turned off. Then, the gate valve GV2 and the valve AV2 are turned off, and the pump TMP2 and the dry pump Dry2 are stopped. Pressure of the load lock chamber 2 is increased by turning on the valve LV20, which is connected with the $N_2$ line 7. When pressure within the load lock chamber 2 becomes atmospheric pressure, the valve LV20 is turned off. The valve LV20 may be automatically turned off based on a barometric pressure sensor.

After all operations are finished, a temperature controller can be turned off, and the pump TMP1 and the dry pump Dry1 are stopped, and the valve GV1, the valve AV1, the valve AV4, and the valve AV5 are turned off. Then, pressure in the heating vacuum chamber 1 is increased by turning on the valve LV21, which is connected with $N_2$ line 9. The valve LV21 may be automatically turned off based on a barometric pressure sensor.

Figure 4:
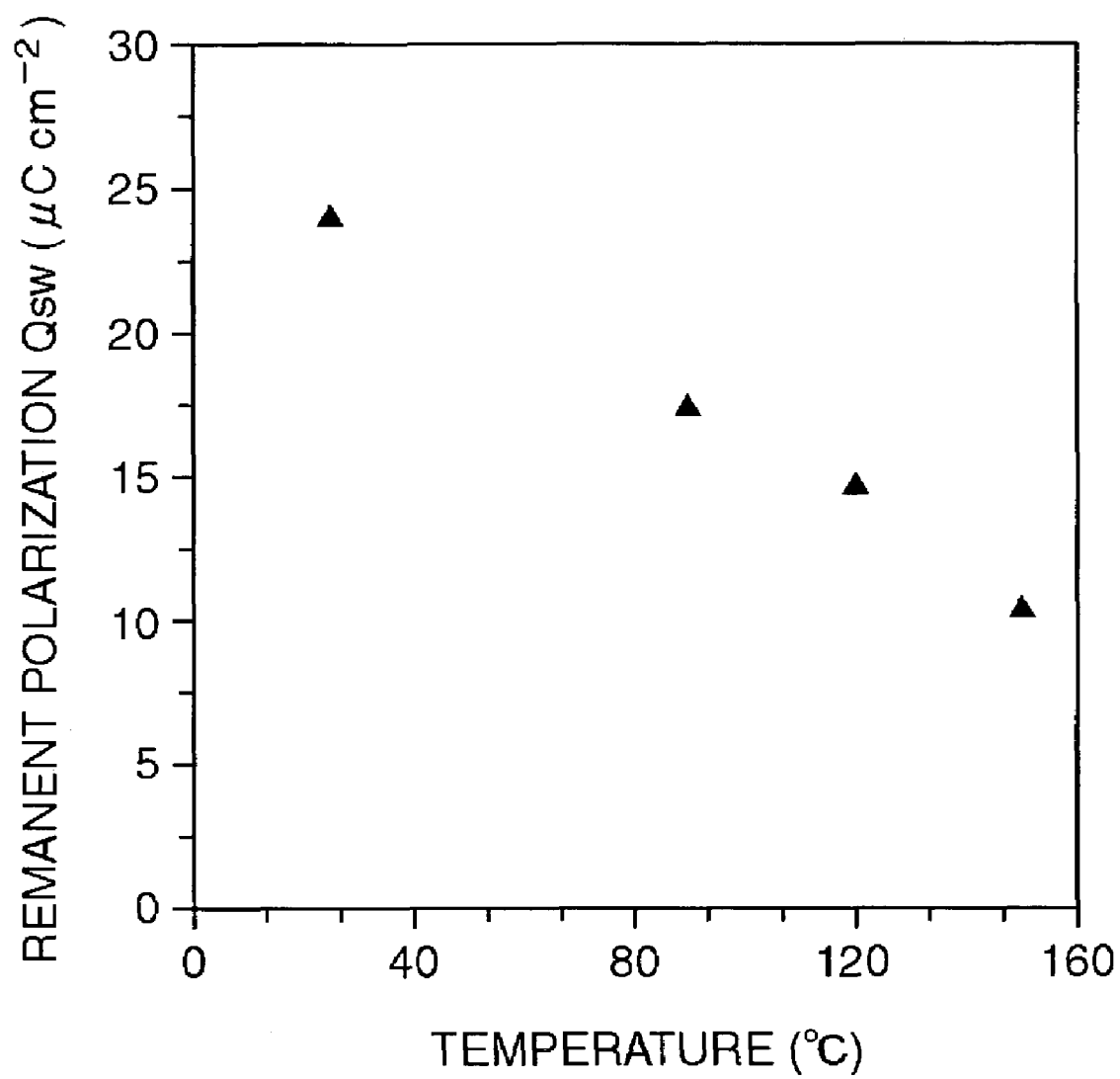
FIG. 4 is a graphic chart for showing the relationship between temperature and remanent polarization.

This kind of experiment is suitable for measuring influence of temperature against remanent polarization Qsw while flowing $N_2$ into the heat-resistant range of the probe 5 such as room temperature, 90° C., 120° C., 150° C. or the like. According to the measurement example shown in FIG. 4, remanent polarization decreases by 60% when measurement temperature is set up as 150° C., compared to measurement at room temperature. Repetition storage is known to be sensitive to temperature, and remanent polarization Qsw is thought to be lost.

Figure 5:
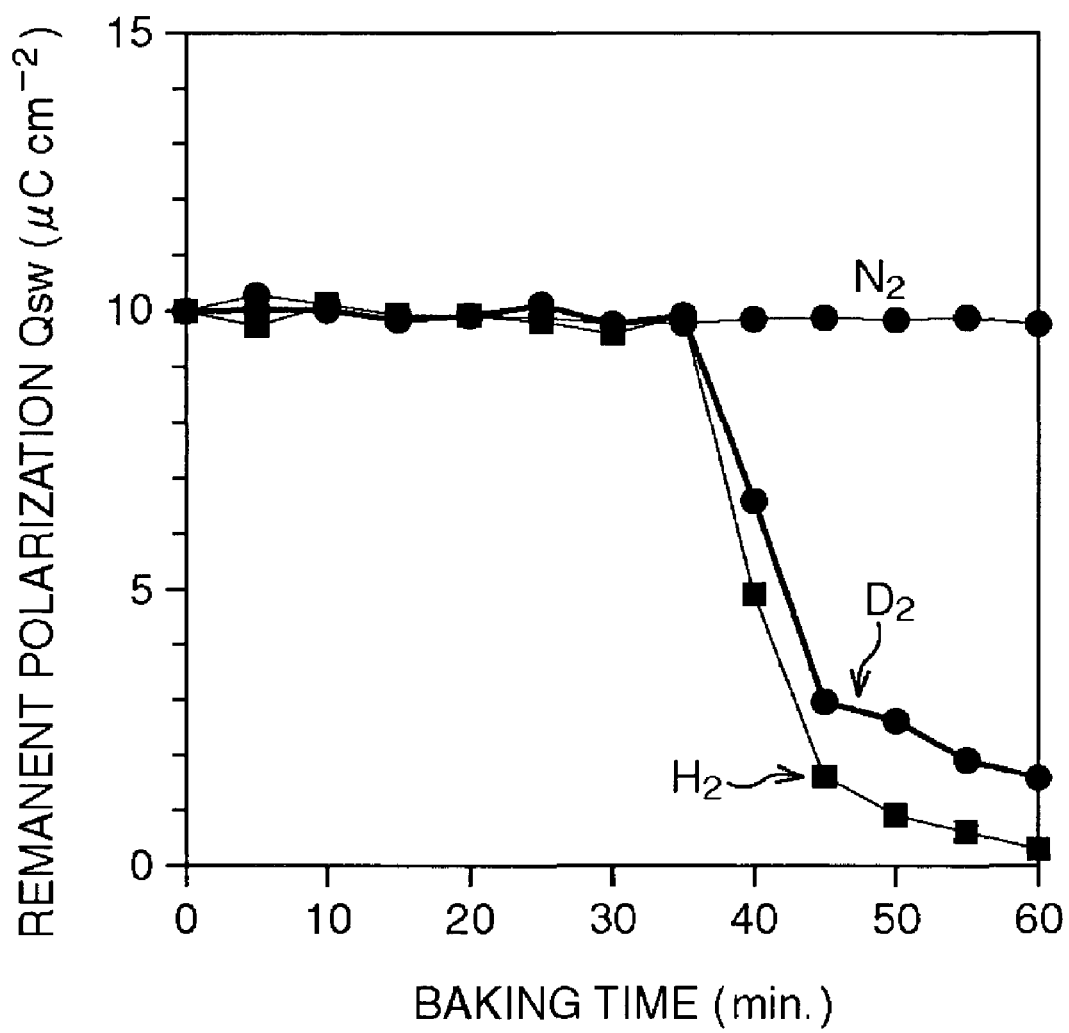
FIG. 5 is a graphic chart for showing the relationship between baking time and remanent polarization.

Other samples can be experimented by changing experimental conditions after the above-described experiment finishes. For example, gas composition can be changed while measurement temperature is fixed at 150° C. FeCap can be baked in the atmosphere of e.g., 100 vol % $N_2$, 3 vol % $H_2$+97 vol % $N_2$, and 3 vol % $D_2$+97 vol % $N_2$. Their results can be seen in FIG. 5. According to the example shown in FIG. 5, characteristic of a ferroelectric capacitor is lost only in the atmosphere which contains $H_2$ and $D_2$, and the counterpart is not lost in the atmosphere which contains 100 vol % $N_2$. Mechanism of this kind of loss is written in e.g., J. S. Cross et al, Jap. J. Appl. Phys., 41 698 (2002).

Here is a description of method of measuring in the air.

In this measurement, after a sample has been produced, the lid of the load lock chamber 2 is opened. Then, either a sample whose dimension is 50×50 μm² placed in a wafer tray (not shown) with 150 mm in diameter or a wafer whose diameter is 150 nm or 200 nm can be placed in the carrier arm within the load lock chamber 2. This wafer tray is made of, e.g., stainless steel.

This wafer tray is heat up to 150° C. by the temperature controller (not shown). This temperature is stabilized in an hour, for example. Then, the gate valve GV3 is turned on, and the sample is conveyed to the heating vacuum chamber 1 by the carrier arm.

The carrier pin in the heating vacuum chamber 1 is raised so that the carrier pin can pick up the wafer tray. After that, the carrier arm returns to the load lock chamber 2. Then, the carrier pin is climbed down so that the sample can be placed on the heating table 3. The gate valve 3 is turned off.

$N_2$ in the heating vacuum chamber 1 is purged for an hour at the 1000 sccm flow rate. At the same time, concentration of $O_2$ and $H_2O$ in the exhaust gas is detected by the sensor 4. In other words, by turning on the valve LV14 and the valve LV15, an exhaust gas from the heating vacuum chamber 1 is flowed into the sensor 4, which measures concentrations of the residual $H_2O$ and the residual $O_2$. They are regularly measured, and e.g., displayed on the display device, and recorded at the personal computer.

The probe 5 is climbed down to a position above a capacitor formed in the sample whose electrical characteristic is supposed to be measured. The plane shape of the capacitor is e.g., a square with 50 μm of each length. The location of the probe 5 and the capacitor can be confirmed by LCD which is connected with the CCD microscope 6. Each location of the probe 5 and the CCD microscope 6 can be moved by using a micrometer manipulator. The probe 5 is contacted with both electrode of the capacitor, which can be confirmed by electrical measurement. The valve LV1 is turned on, and the flow rate is set up as 500 sccm by the mass flow controller. Then, $N_2$ gas is introduced from the gas introducing port to the inside of the heating vacuum chamber 1.

In order to measure capacitance loss, flow rate for $N_2$ line is set up as 0 sccm by the mass flow controller, and the counterpart for 3 vol % $H_2$+97 vol % $N_2$ is set up as 500 sccm. Then, remanent polarization Qsw of the ferroelectric capacitor is measured in the same way as the above-described method when done in a vacuum. Remanent polarization Qsw can be measured every five minutes until it decreases by 10% from the time measurement has started.

After remanent polarization Qsw was measured, the flow rate for 3 vol % $H_2$+97 vol % $N_2$ line is set up as 0 sccm by the mass flow controller, and the gate valve LV1 is turned off. The gate valve GV3 is turned on after the gas which contains $H_2$ is completely exhausted. The wafer tray on the heating table 3 is lifted up to the height by the carrier pin where it is conveyable. The carrier arm is extended to inside the heating vacuum chamber 1, and the wafer tray is placed on the carrier arm. The wafer tray is conveyed to the load lock chamber 2, and the gate valve GV3 is turned off. The temperature controller is turned off and temperature of the wafer tray is slowly cooled down until it reaches to room temperature.

The above-described method is measurement in the air.

The following description is the method of measuring in the atmosphere which contains water vapor. The inspection device relating to the present embodiment can be used for in-site measurement such as fatigue in the gas atmosphere which contains $H_2$, $D_2$, $H_2O$ vapor and $D_2O$ vapor, (E. Colla, et al., Appl. Phys. Lett., 72, 2763 (1998)), dielectric breakdown (I. Stolichnov, et al., J. Appl. Phys., 87 1925 (2000)) and imprint (S. D. Traynor, T. D. Hadnagy, and L. Kammerdiner, Intergrat. Ferro. 16 63–76 (1997)). Liquid water is contained in a stainless container in the gas bubbler 8, and water vapor can be introduced into the heating vacuum chamber 1 by flowing the gas there. An amount of water vapor in the heating vacuum chamber 1 can be detected by the sensor 4. Its amount can be adjusted by controlling the gas flow rate flowing in the gas bubbler 8 and temperature of the gas bubbler 8. There is a report that water vapor loses dielectric breakdown voltage of FeCap by electrolysis reaction on lower electrode made from Pt (Chen et al. Appl. Phys. Lett., 80 3587 (2002) and J. D. Baniecki, et al., Appl. Phys. Lett. (to be submitted)).

According to the inspection device of a dielectric film relating to the present preferred embodiment, remanent polarization of the ferroelectric film can be measured without taking the sample out of the heating vacuum chamber 1 while baking the ferroelectric film if temperature is within the range of heat-resistance of the probe 5, e.g., from room temperature to less than 150° C. Accordingly, because remanent polarization can be consecutively measured, loss of the ferroelectric film can be accurately measured at the point when the time has lapsed. Furthermore, since one baking is enough, less steps and times are required for inspection, which improves productivity.

The gas used for baking the ferroelectric film can be easily changed and partial pressure of the residual gas can be easily measured. Therefore, it is easy to assess the gas which loses the least of characteristic of the dielectric film. Deterioration speed of the capacitor accompanied by dissociation of hydrogen also depends on partial pressure of residual oxygen in the chamber. This kind of dependence is remarkable when an $IrO_2$ electrode is used. The present preferred embodiment makes it possible to measure partial pressure of the residual oxygen. Therefore, even if deterioration speed of the capacitor fluctuates by using the $IrO_2$ electrode, it is possible to estimate factor(s) of deterioration of characteristic by relating to partial pressure of the residual oxygen.

When baking it at the temperature which is above the heat resistance of the probe 5 such as e.g., over 150° C. (e.g., under 500° C.), the probe 5 can be put aside from the sample. Characteristic of the dielectric film can be measured under this condition. However, it cannot be measured while baking it at the same time.

The sample can be cooled down (quenched) by speedily taking the sample out of the heating vacuum chamber 1 by using the carrier arm. Characteristic of the sample can be measured while maintaining the condition of baking.

The valve LV14 may be turned on when the inside of the heating vacuum chamber 1 is filled with atmosphere without the dry pump Dry1 and so on.

The inspection device according to the present preferred embodiment can be used for measuring not only characteristic of the ferroelectric film formed in a ferroelectric memory but also characteristic of other ferroelectric film. The above-mentioned device can also be used for measuring characteristics of not only a ferroelectric film but also dielectric films such as $AlO_x$, $SiO_2$, $TaO_x$, $(Ba, Sr)TiO_3$ and the like.

Figure 6:
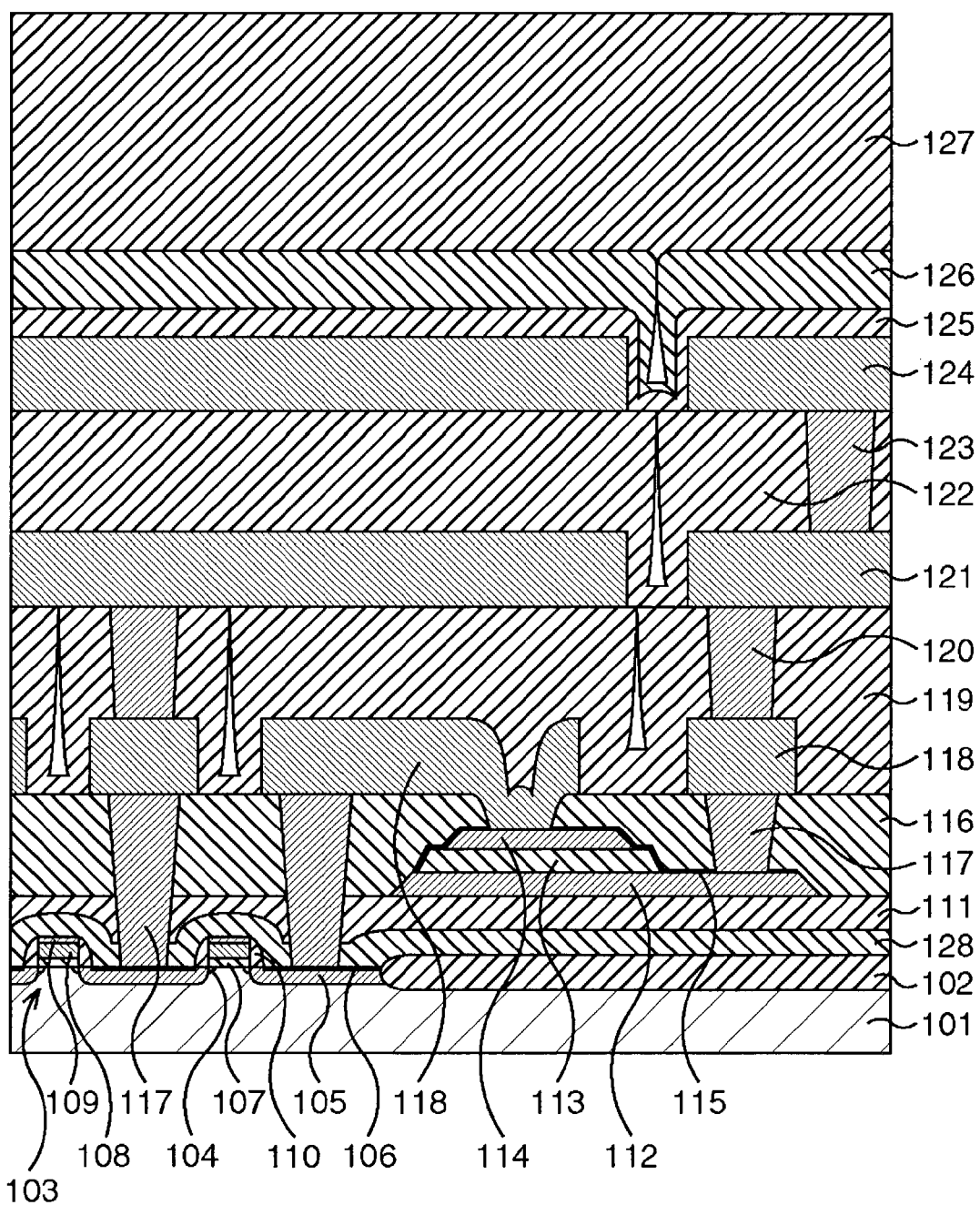
FIG. 6 is a schematic cross-sectional view for showing a structure of a ferroelectric memory.

FIG. 6 is a schematic cross-sectional view for showing a structure of a ferroelectric memory on which a ferroelectric film is formed, based on the preferable condition which has been figured out by the preferred embodiment of the inspection device of a dielectric film.

An element isolation insulating film 102 is selectively formed on the surface of a semiconductor substrate 101. A MOS transistor 103 is formed within the range which is defined blocked by the element isolation insulating film 102. A low-concentration diffusion layer 104, a high-concentration diffusion layer 105, a titanium silicide 106, a gate insulation film 107, a gate electrode 108, a tungsten silicide film 109, and a sidewall 110 are formed in the MOS transistor 103. A silicon oxynitride film 128 is formed to cover the element isolation insulating film 102 and the MOS transistor 103, and a silicon oxide film 111 which serves as an interlayer insulation film is formed on it.

A lower electrode 112 is selectively formed on the silicon oxide film 111. A ferroelectric film 113 and an upper electrode 114 are formed on it with the above-described order. In a plane view, the ferroelectric film 113 is smaller than the lower electrode 112, and the upper electrode 114 is smaller than the ferroelectric film 113. The lower electrode 112, the ferroelectric film 113, and the upper electrode 114 form a ferroelectric capacitor. A film 115 is formed to cover the ferroelectric capacitor. A silicon oxide film 116 which serves as an interlayer insulation film to cover this ferroelectric capacitor and the like is formed on it.

A hole which reaches to the lower electrode 112 is formed in the silicon oxide film 116 and the film 115. Another hole which reaches to the titanium silicide 109 of the MOS transistor 103 is formed in the silicon oxide films 116 and 111. A tungsten film 117 is embedded in these holes. A hole which reaches to the upper electrode 114 is formed in the silicon oxide film 116 and the film 115. A wiring layer 118 connected with the tungsten film 117 is formed on the silicon oxide film 116. A portion of this wiring layer 118 is connected with the upper electrode 114 through the hole which reaches to the upper electrode 114. Accordingly, the upper electrode 114 and the high-concentration diffusion layer 105 of the MOS transistor 103 are connected with each other via the wiring layer 118. A silicon oxide film 119 which serves as an interlayer insulation film to cover the wiring layer 118 is formed on the silicon oxide film 116.

A hole which reaches to the wiring layer 118 is formed in the silicon oxide film 119 and a tungsten film 120 is embedded in this hole. A wiring layer 121 connected with the tungsten film 120 is formed on the silicon oxide film 119. A silicon oxide film 122 which serves as an interlayer insulation film to cover the wiring layer 121 is formed on the silicon oxide film 119.

A hole which reaches to the wiring layer 121 is formed in the silicon oxide film 122 and a tungsten film 123 is embedded in this hole. A wiring layer 124 connected with the tungsten film 123 is formed on the silicon oxide film 122. A pad silicon oxide film 125 and a pad silicon nitride film 126 to cover the wiring layer 124 are formed on the silicon oxide film 122 with the above-described order. A sealing film 127 made from e.g., polyimide, is formed on the pad silicon nitride film 126.

The inspection device of a dielectric film relating to the preferred embodiment could be used for optimizing conditions when the ferroelectric film 113 of the ferroelectric capacitor is formed. By using the inspection device of a dielectric film, a ferroelectric film is formed under plural deposition conditions. Change of remanent polarization against baking time can be calculated under each deposition condition. The ferroelectric film 113 can be formed by selecting the most suitable condition from the plural deposition conditions.

Figure 7:
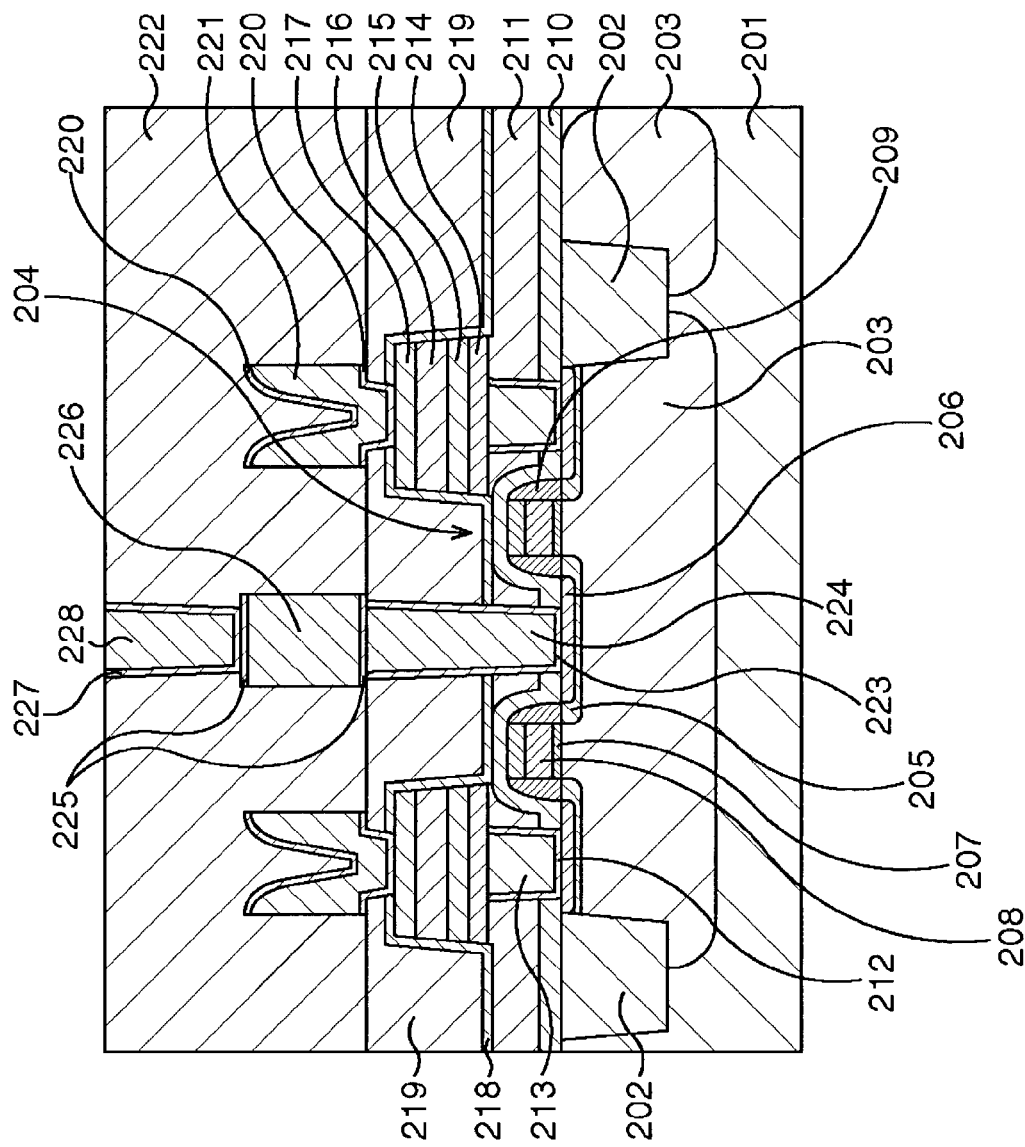
FIG. 7 is a schematic cross-sectional view for showing a structure of another ferroelectric memory.
Figure 8:
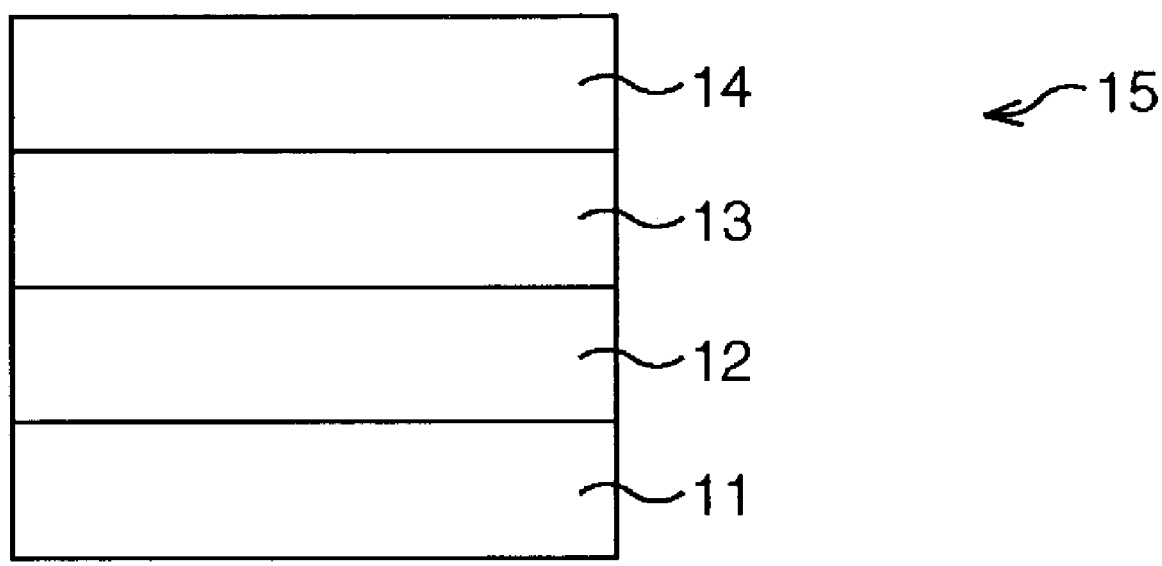
FIG. 8 is a schematic cross-sectional view for showing a structure of a ferroelectric capacitor.

FIG. 7 is a schematic cross-sectional view for showing a structure of an alternative ferroelectric memory on which a ferroelectric film is formed, based on the condition which has been figured out by the preferred embodiment of an inspection device of a dielectric film.

An element isolation insulating film 202 is formed on the surface of a semiconductor substrate 201. A well 203 is formed in a surficial portion of the semiconductor substrate 201 within the element range which is defined by the element isolation insulating film 202. A MOS transistor 204 is formed on the well 203. A low-concentration diffusion layer 205, a high-concentration diffusion layer 206, a gate insulation film 207, a gate electrode 208, and a sidewall 209 are formed in the MOS transistor 204. A silicon oxynitride film 210 and a silicon oxide film 211 are formed to cover them. A siliside layer is formed between the gate electrode 208 and the silicon oxynitride film 210.

One of the high-concentration diffusion layers 206 of each MOS transistor 204 is shared between the two MOS transistors. Contact holes are formed in the silicon oxynitride film 210 and the silicon oxide film 211 on the other high-concentration diffusion layers 206. A barrier metal film 212 and an electric conductive film 213 are embedded in these contact holes.

A stack structured capacitor is formed on the electric conductive film 213. This capacitor is composed of a barrier metal film 214, a lower electrode 215, a ferroelectric film 216 and an upper electrode 217 which are formed on the electric conductive film 213 with the above-described order. A film 218 to cover this ferroelectric capacitor is formed on it. An interlayer insulation film 219 is formed on it. A hole which reaches to the upper electrode 217 is formed in the interlayer insulation film 219. A wiring 221 which is connected with the upper electrode 217 through this hole is formed on the interlayer insulation film 219. A barrier metal film 220 is formed on both the top and the bottom of the wiring 221, and an interlayer insulation film 222 is formed to cover the wiring 221.

A contact hole which reaches to the high-concentration diffusion layer 206 shared by two MOS transistors 204 is formed in the interlayer insulation film 219, the film 218, the silicon oxide film 211 and the silicon oxynitride film 210. A barrier metal film 223 and an electric conductive film 224 are embedded in this contact hole. A wiring 226 which is made from the same layer of the wire 221 and a barrier metal film 225 which is made from the same layer of the barrier metal film 220 are connected with the electric conductive film 224. A hole which reaches to the upper barrier metal film 225 is formed in the interlayer insulation film 222, and a barrier metal film 227 and wiring 228 connected with an upper wiring (not shown) is embedded in this hole.

As described above, this invention makes it possible to inspect a dielectric film in-site while heating (baking a dielectric film) a sample in a chamber. Therefore, it is easy to keep track of response of the dielectric film while baking it and to assess the exact time when its characteristic changes. There is no need to take a sample out of the chamber many times; therefore, inspection time becomes shorter. As a result, productivity of a semiconductor device equipped with this kind of dielectric film is improved.

The present embodiments are to be considered in all respects as illustrative and no restrictive, and all changes which come within the meaning and range of equivalency of the claims are therefore intended to be embraced therein. The invention may be embodied in other specific forms without departing from the spirit or essential characteristics thereof.

What is claimed is:

1. An inspection device of a dielectric film, comprising:
a chamber for taking in a sample with which a dielectric film is provided and which is intended for inspection;
a probe equipped in said chamber;
a heater for heating said sample taken in said chamber;
measuring device for measuring a characteristic of said dielectric film with said probe when said sample is heated by said heater; and
an oxygen concentration measuring device for measuring concentration of oxygen in a gas which is exhausted from said chamber.

2. The inspection device according to claim 1, further comprising:
a gas introducer for introducing a gas for baking which contains at least one kind of gases selected from a group of hydrogen gas and heavy hydrogen gas into said chamber.

3. The inspection device according to claim 2, further comprising:
a source of liquid to add at least one kind of vapor selected from a group of water and deuterium oxide into said gas for baking.

4. The inspection device according to claim 2, wherein said gas for baking contains at least one kind of gases selected from a group of oxygen gas and nitrogen gas.

5. The inspection device according to claim 1, further comprising:
a gas introducer for introducing a gas for baking which contains at least one kind of vapor selected from a group of water and deuterium oxide into said chamber.

6. The inspection device according to claim 1, further comprising:
a moisture concentration measuring device for measuring concentration of moisture in a gas which is exhausted from said chamber.

7. The inspection device according to claim 1, further comprising:
a component measuring device for measuring components in a gas in said chamber.

8. The inspection device according to claim 1, further comprising:
a location detector for detecting locations of said sample and said probe.

9. The inspection device according to claim 1, further comprising:
a flowmeter for measuring flow rate of a gas exhausted from said chamber.

10. The inspection device according to claim 1, further comprising:
a barometric pressure adjuster for adjusting barometric pressure in said chamber.

11. The inspection device according to claim 1, further comprising:
a recorder for recording components of a gas in said chamber.

12. The inspection device according to claim 1, further comprising:
a display for displaying components of a gas in said chamber.

13. The inspection device according to claim 1, further comprising:
a load lock chamber linked with said chamber.

14. The inspection device according to claim 1, wherein said measuring device comprises an electric supplier which supplies electric current from said probe to said dielectric film.

15. An inspection method of a dielectric film, comprising the steps of:
placing a sample with which a dielectric film is provided and which is intended for inspection in a chamber; and
measuring a characteristic of said dielectric film with a probe while heating said sample, said measuring a characteristic of said dielectric film comprises measuring a concentration of oxygen in a gas exhausted from said chamber.

16. The inspection method according to claim 15, wherein temperature of said sample is set below a temperature of heat resistance of said probe in said step of measuring characteristic of said dielectric film.

17. The inspection method according to claim 15, further comprising:
a step of introducing a gas for baking which contains at least one kind of gases selected from a group of hydrogen gas and heavy hydrogen gas into said chamber between said step of placing the sample and said step of measuring characteristic of the dielectric film.

18. The inspection method according to claim 15, wherein said step of measuring characteristic of the dielectric film comprises a step of measuring concentration of moisture in a gas exhausted from said chamber.

19. A method of manufacturing a semiconductor device, comprising the steps of:
calculating a relationship between conditions of forming a ferroelectric film and change of remanent polarization of said ferroelectric film against baking time based on said inspection method according to claim 15; and
forming a ferroelectric film under a condition which has been determined based on said relationship.

* * * * *